United States Patent
Lai et al.

(10) Patent No.: US 9,852,985 B1
(45) Date of Patent: Dec. 26, 2017

(54) CONDUCTIVE TERMINAL ON INTEGRATED CIRCUIT

(71) Applicant: Taiwan Semiconductor Manufacturing Co., Ltd., Hsinchu (TW)

(72) Inventors: Yu-Chia Lai, Miaoli County (TW); Chen-Hua Yu, Hsinchu (TW); Chang-Pin Huang, Taoyuan (TW); Chung-Shi Liu, Hsinchu (TW); Hsien-Ming Tu, Hsinchu County (TW); Hung-Yi Kuo, Taipei (TW); Hao-Yi Tsai, Hsinchu (TW); Shih-Wei Liang, Taichung (TW); Ren-Xuan Liu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/275,460

(22) Filed: Sep. 25, 2016

Related U.S. Application Data

(60) Provisional application No. 62/354,819, filed on Jun. 27, 2016.

(51) Int. Cl.
| | |
|---|---|
| *H01L 23/52* | (2006.01) |
| *H01L 23/528* | (2006.01) |
| *H01L 23/522* | (2006.01) |
| *H01L 23/31* | (2006.01) |
| *H01L 23/00* | (2006.01) |

(52) U.S. Cl.
CPC ........ *H01L 23/528* (2013.01); *H01L 23/3171* (2013.01); *H01L 23/5226* (2013.01); *H01L 24/05* (2013.01); *H01L 24/06* (2013.01); *H01L 2224/05624* (2013.01); *H01L 2224/05647* (2013.01)

(58) Field of Classification Search
CPC ..... H01L 24/05; H01L 24/06; H01L 23/3171; H01L 23/5226; H01L 23/528
USPC ........................................................ 257/774
See application file for complete search history.

(56) References Cited

U.S. PATENT DOCUMENTS

| | | | | |
|---|---|---|---|---|
| 6,191,023 | B1 * | 2/2001 | Chen ....................... | H01L 24/03 257/E21.508 |
| 6,803,302 | B2 * | 10/2004 | Pozder .................... | H01L 24/03 257/E21.508 |
| 7,214,604 | B2 * | 5/2007 | Kim ........................ | H01L 24/11 257/E21.508 |

(Continued)

*Primary Examiner* — Luan C Thai
(74) *Attorney, Agent, or Firm* — JCIPRNET

(57) ABSTRACT

A conductive terminal on an integrated circuit is provided. The conductive terminal includes a conductive pad, a dielectric layer, and a conductive via. The conductive pad is disposed on and electrically to the integrated circuit. The dielectric layer covers the integrated circuit and the conductive pad, the dielectric layer includes a plurality of contact openings arranged in array, and the conductive pad is partially exposed by the contact openings. The conductive via is disposed on the dielectric layer and electrically connected to the conductive pad through the contact openings. The conductive via includes a plurality of convex portions arranged in array. The convex portions are distributed on a top surface of the conductive via, and the convex portions are corresponding to the contact openings.

20 Claims, 4 Drawing Sheets

(56) References Cited

U.S. PATENT DOCUMENTS

| | | | |
|---|---|---|---|
| 7,420,283 B2* | 9/2008 | Ito | H01L 24/03 257/779 |
| 8,021,976 B2* | 9/2011 | Lee | H01L 24/03 257/751 |
| 8,994,181 B2* | 3/2015 | Chen | H01L 23/291 257/774 |
| 2015/0364430 A1* | 12/2015 | Lin | H01L 23/562 257/773 |

* cited by examiner

CONDUCTIVE TERMINAL ON INTEGRATED CIRCUIT

CROSS-REFERENCE TO RELATED APPLICATION

This application claims the priority benefits of U.S. provisional application Ser. No. 62/354,819, filed on Jun. 27, 2016. The entirety of the above-mentioned patent application is hereby incorporated by reference herein and made a part of this specification.

BACKGROUND

Integrated circuits are used in a variety of electronic applications, such as personal computers, cell phones, digital cameras, and other electronic equipment. Integrated circuits are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a semiconductor wafer, and the integrated circuits are test or inspected by chip-probing process. During the chip-probing process, the probe is pressed on the conductive terminals of the integrated circuits, and the testing stability of the chip-probing process is relevant to the morphology of the conductive terminals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
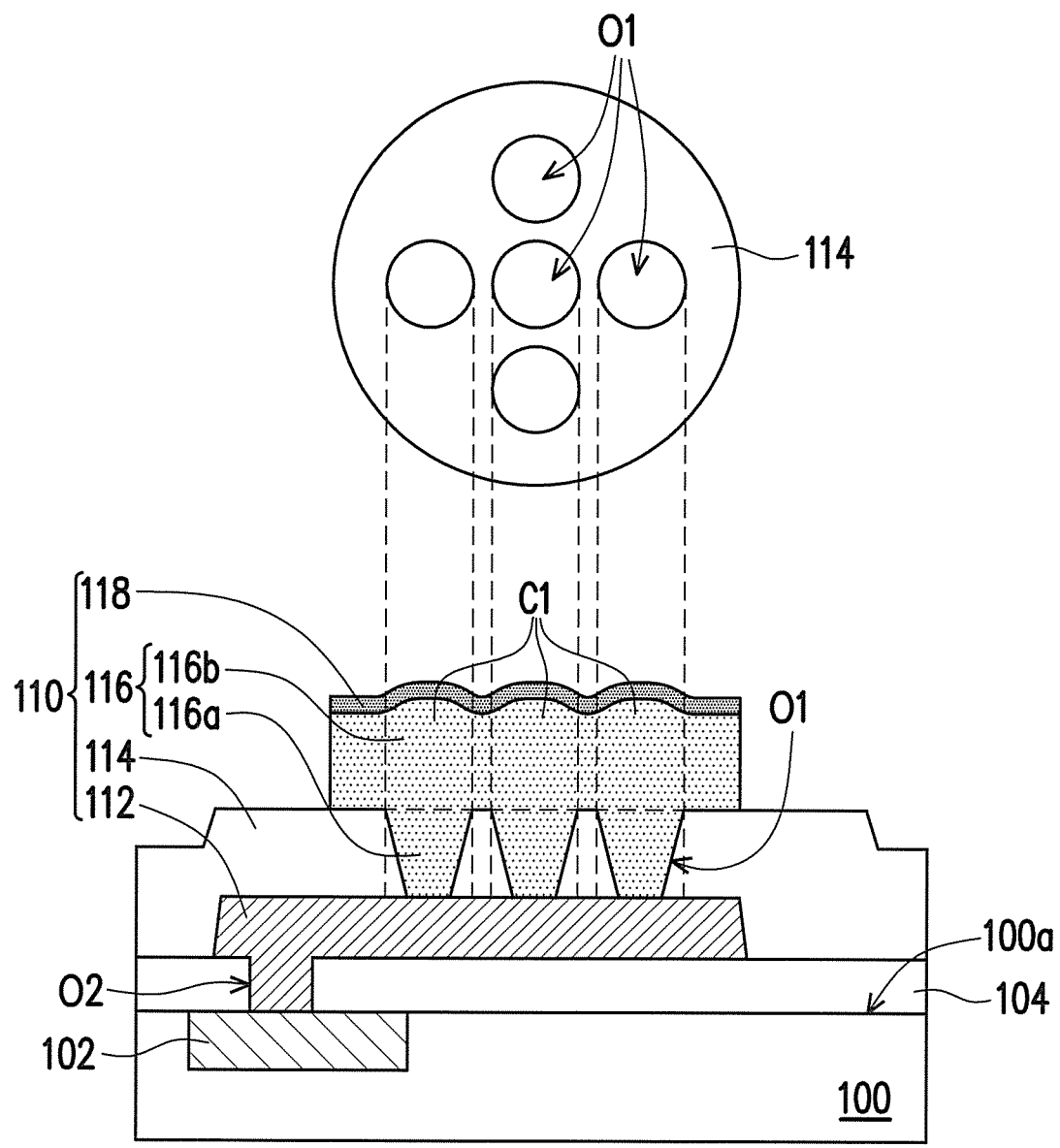
FIG. 1 is a schematic view illustrating a conductive terminal on an integrated circuit according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view illustrating a conductive terminal on an integrated circuit according to some exemplary embodiments of the present disclosure. Referring to FIG. 1, in some exemplary embodiments, a conductive terminal 110 on an integrated circuit 100 is provided. The conductive terminal 110 includes a conductive pad 112, a dielectric layer 114, and a conductive via 116. The conductive pad 112 is disposed on and electrically to the integrated circuit 100. The dielectric layer 114 covers the integrated circuit 100 and the conductive pad 112, the dielectric layer 114 includes a plurality of contact openings O1 arranged in array, and the conductive pad 112 is partially exposed by the contact openings O1. The conductive via 116 is disposed on the dielectric layer 114 and electrically connected to the conductive pad 112 through the contact openings O1. The conductive via 116 includes a plurality of convex portions C1 arranged in array. The convex portions C1 are distributed on a top surface of the conductive via 116, and the convex portions C1 are corresponding to the contact openings O1 of the dielectric layer 114. In some embodiments, the convex portions C1 are above the contact openings O1.

The integrated circuit 100 may include a semiconductor substrate, and the semiconductor substrate includes active components (e.g., transistors and so on) and passive components (resistors, inductors, capacitors, and so on) formed therein. In some embodiments, the integrated circuit 100 may include a plurality of bonding pads 102 and a passivation layer 104 formed on the active surface 100a thereof. Only one bonding pad 102 is shown in FIG. 1 for illustration, and the number of the bonding pad 102 is not limited in this disclosure. The bonding pad 102 is electrically connected to the active components and/or the passive components through an interconnection layer underneath. The interconnection layer is a part of the integrated circuit 100, and the bonding pad 102 having a pre-determined pattern may be considered as a top metal layer of the interconnection. The passivation layer 104 covers the active surface 100a of the integrated circuit 100 and includes a plurality of contact openings O2. Only one contact opening O2 is shown in FIG. 1 for illustration, and the number of the contact opening O2 is not limited in this disclosure. The bonding pad 102 is exposed by the contact opening O2 of the passivation layer 104. For example, the passivation layer 104 is formed of un-doped silicate glass (USG), silicon nitride, silicon oxy-nitride, silicon oxide, or combinations thereof, but is not limited by the above-mentioned materials.

As shown in FIG. 1, the conductive pad 112 of the conductive terminal 110 is formed on the passivation layer 104, and the conductive pad 112 is electrically connected to the bonding pad 102 of the integrated circuit 100 through the contact opening O2 of the passivation layer 104. In some embodiments, the conductive pad 112 may be an aluminum pad, a copper pad, or other suitable metallic pad.

For example, the dielectric layer 114 is formed of polymer, polyimide, benzocyclobutene (BCB), polybenzooxazole (PBO), or any other suitable dielectric material, but is not limited by the above-mentioned materials. In some embodiments, the materials of the passivation layer 104 and the dielectric layer 114 are different. However, in other embodiments, the materials of the passivation layer and the dielectric layer may be the same according to design requirements.

The contact openings O1 of the dielectric layer 114 are circular contact openings, and the diameter of each contact opening O1 ranges from about 8 micrometers to about 10 micrometers, for example. The spacing between two neighboring contact openings O1 ranges from about 3 micrometers to about 5 micrometers, for example. The contact openings O1 are filled by the conductive via 116, and the dielectric layer 114 is partially covered by the conductive via 116. The diameter of the circular area occupied by the conductive via 116 ranges from about 45 micrometers to about 50 micrometers, for example. In this embodiment, the diameter of each contact opening O1 is about 10 micrometers, the spacing between two neighboring contact openings O1 is about 3 micrometers, and the diameter of the circular area occupied by the conductive via 116 is about 50 micrometers.

In some embodiments, the conductive via 116 may include a plurality of first conductive portions 116a embedded in the contact openings O1 of the dielectric layer 114 and a second conductive portion 116b connected to the first conductive portions 116a, and the second conductive portion 116b covers the first conductive portions 116a and the dielectric layer 114. The convex portions C1 are distributed on the top surface of the second conductive portion 116b.

As shown in FIG. 1, the contact openings O1 of the dielectric layer 114 are arranged alone two orthogonal paths on a plane where the dielectric layer 114 is deposited. For example, the contact openings O1 of the dielectric layer 114 are arranged alone a horizontal path and a vertical path on the plane where the dielectric layer 114 is deposited. The arrangement of the contact openings O1 is not limited in this disclosure. The contact openings O1 may be arranged uniformly between the conductive pad 112 and the conductive via 116. The contact openings O1 may be arranged regularly or randomly, for example.

Since the area of the contact openings O1 formed in the dielectric layer 114 ranges from about 251.3 $\mu m^2$ to about 392.7 $\mu m^2$, the convex portions C1 are formed and distributed on the top surface of the conductive via 116 after forming the conductive via 116. It is noted that the dimension and the position of the convex portions C1 correspond to those of the contact openings O1 of the dielectric layer 114. In some embodiments, the conductive via 116 is formed through a plating process, and the convex portions C1 of the conductive via 116 are formed due to the morphology of the dielectric layer 114.

In some embodiments, the area of the convex portions C1 of the conductive via 116 may be about 15.8% to about 20% of the area occupied by the conductive via 116. Since the area of the convex portions C1 is sufficient for chip-probing, the convex portions C1 of the conductive via 116 facilitate the chip probing process performed on the conductive terminal 110. During the chip-probing process performed on the conductive terminal 110 on the integrated circuit 100, a probe having a Micro-Electro-Mechanical System (MEMS) flat tip is provided, and the MEMS flat tip is pressed on and in contact with the convex portions C1 of the conductive terminal 110. The contact condition between the convex portions C1 of the conductive terminal 110 and the MEMS flat tip is stable. Accordingly, the testing stability of the chip-probing process is good due to the morphology (i.e. the convex portions C1) of the conductive terminal 110.

As shown in FIG. 1, before performing the chip-probing process, a conductive cap 118 may be optionally formed to conformally cover the top surface of the conductive via 116. In some embodiments, the conductive cap 118 is a solder cap, for example. The conductive cap 118 (e.g., solder cap) facilitates the chip-probing process. After the chip-probing process is performed, the conductive cap 118 (e.g., solder cap) may be removed from the top surface of the conductive via 116. In other words, the conductive cap 118 (e.g., solder cap) may not exit after the chip-probing process is performed.

Figure 2:
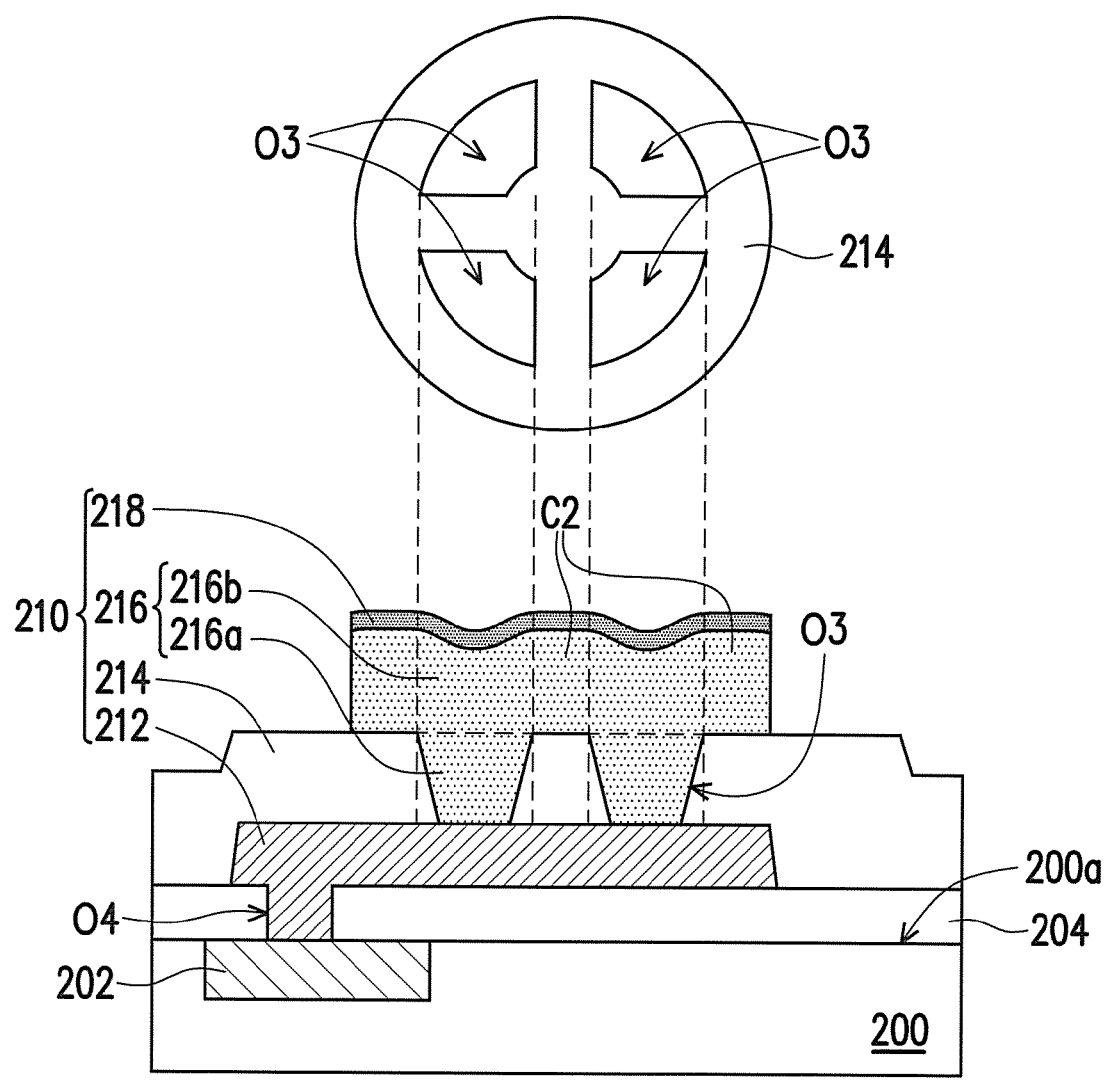
FIG. 2 is a schematic view illustrating a conductive terminal on an integrated circuit according to some alternative exemplary embodiments of the present disclosure.

FIG. 2 is a schematic view illustrating a conductive terminal on an integrated circuit according to some alternative exemplary embodiments of the present disclosure. Referring to FIG. 2, a conductive terminal 210 on an integrated circuit 200 is provided. The conductive terminal 210 includes a conductive pad 212, a dielectric layer 214, and a conductive via 126. The conductive pad 212 is disposed on and electrically to the integrated circuit 200. The dielectric layer 214 covers the integrated circuit 200 and the conductive pad 212. The dielectric layer 214 includes a plurality of contact openings O3, and the conductive pad 212 is partially exposed by the contact openings O3. The conductive via 216 is disposed on the dielectric layer 214 and electrically connected to the conductive pad 212 through the contact openings O3. The conductive via 216 includes a plurality of convex portions C2. The convex portions C2 are distributed on a top surface of the conductive via, and the convex portions C2 are corresponding to the dielectric layer 214 covered by the conductive via 216. In some embodiments, the convex portions C2 are above the dielectric layer 214 covered by the conductive via 216.

The integrated circuit 200 may include a semiconductor substrate, and the semiconductor substrate includes active components (e.g., transistors and so on) and passive components (resistors, inductors, capacitors, and so on) formed therein. In some embodiments, the integrated circuit 200 may include a plurality of bonding pads 202 and a passivation layer 204 formed on the active surface 200a thereof. Only one bonding pad 202 is shown in FIG. 2 for illustration, and the number of the bonding pad 202 is not limited in this disclosure. The bonding pad 202 is electrically connected to the active components and/or the passive components through an interconnection layer underneath. The interconnection layer is a part of the integrated circuit 200, and the bonding pad 202 having a pre-determined pattern may be considered as a top metal layer of the interconnection. The passivation layer 204 covers the active surface 200a of the integrated circuit 200 and includes a plurality of contact openings O4. Only one contact opening O4 is shown in FIG. 2 for illustration, and the number of the contact opening O4 is not limited in this disclosure. The bonding pad 202 is exposed by the contact opening O4 of the passivation layer 204. For example, the passivation layer 204 is formed of un-doped silicate glass (USG), silicon nitride, silicon oxy-nitride, silicon oxide, or combinations thereof, but is not limited by the above-mentioned materials.

As shown in FIG. 2, the conductive pad 212 of the conductive terminal 210 is formed on the passivation layer 204, and the conductive pad 212 is electrically connected to the bonding pad 202 of the integrated circuit 200 through the contact opening O4 of the passivation layer 204. In some embodiments, the conductive pad 212 may be an aluminum pad, a copper pad, or other suitable metallic pad.

For example, the dielectric layer 214 is formed of polymer, polyimide, benzocyclobutene (BCB), polybenzooxazole (PBO), or any other suitable dielectric material, but is not limited by the above-mentioned materials. In some embodiments, the materials of the passivation layer 204 and the dielectric layer 214 are different. However, in other embodiments, the materials of the passivation layer 204 and the dielectric layer 214 may be the same according to design requirements.

The contact openings O3 of the dielectric layer 214 are arc-shaped contact openings, and the arc-shaped contact openings O3 are arranged along a circular path whose center of circle is aligned with the center of the conductive via 216. The contact openings O3 are separated from one another by a cross pattern X, and the intersection of the cross pattern X is aligned with the center of the conductive via 216, for example. The width of the arc-shaped contact openings O3 ranges from about 8 micrometers to about 10 micrometers, for example. The spacing between two neighboring arc-shaped contact openings O3 is about 8 micrometers, for example. The arc-shaped contact openings O3 are filled by the conductive via 216, and the dielectric layer 214 is partially covered by the conductive via 216. The diameter of the circular area occupied by the conductive via 216 ranges from about 45 micrometers to about 50 micrometers, for example. In this embodiment, the width of the arc-shaped contact openings O3 is about 10 micrometers, the spacing between two neighboring arc-shaped contact openings O3 is about 8 micrometers, and the diameter of the circular area occupied by the conductive via 216 is about 50 micrometers, for example.

In some embodiments, the conductive via 216 may include a plurality of first conductive portions 216a embedded in the arc-shaped contact openings O3 of the dielectric layer 214 and a second conductive portion 216b connected to the first conductive portions 216a, and the second conductive portion 216b covers the first conductive portions 216a and the dielectric layer 214. The convex portions C2 are distributed on the top surface of the second conductive portion 216b.

Since the area of the arc-shaped contact openings O3 formed in the dielectric layer 214 ranges from about 350 µm² to about 496.8 µm² and the cross pattern X is formed between the arc-shaped contact openings O3, the convex portions C2 are formed and distributed on the top surface of the conductive via 216 after foaming the conductive via 216. It is noted that the dimension and the position of the convex portions C2 correspond to those of the dielectric layer 214 which is covered by the conductive via 216. In some embodiments, the conductive via 216 is formed through a plating process, and the convex portions C2 of the conductive via 216 are formed due to the morphology of the dielectric layer 214.

In some embodiments, the area of the convex portions C2 of the conductive via 216 may be about 74.7% to about 80% of the area occupied by the conductive via 216. Since the area of the convex portions C2 is sufficient for chip-probing, the morphology (i.e. the convex portions C2) of the conductive terminal 210 of the conductive via 216 enhance the testing stability of the chip-probing process.

As shown in FIG. 2, before performing the chip-probing process, a conductive cap 218 may be optionally formed to conformally cover the top surface of the conductive via 216. In some embodiments, the conductive cap 218 is a solder cap, for example. The conductive cap 218 (e.g., solder cap) facilitates the chip-probing process. After the chip-probing process is performed, the conductive cap 218 (e.g., solder cap) may be removed from the top surface of the conductive via 216. In other words, the conductive cap 218 (e.g., solder cap) may not exit after the chip-probing process is performed.

Figure 3:
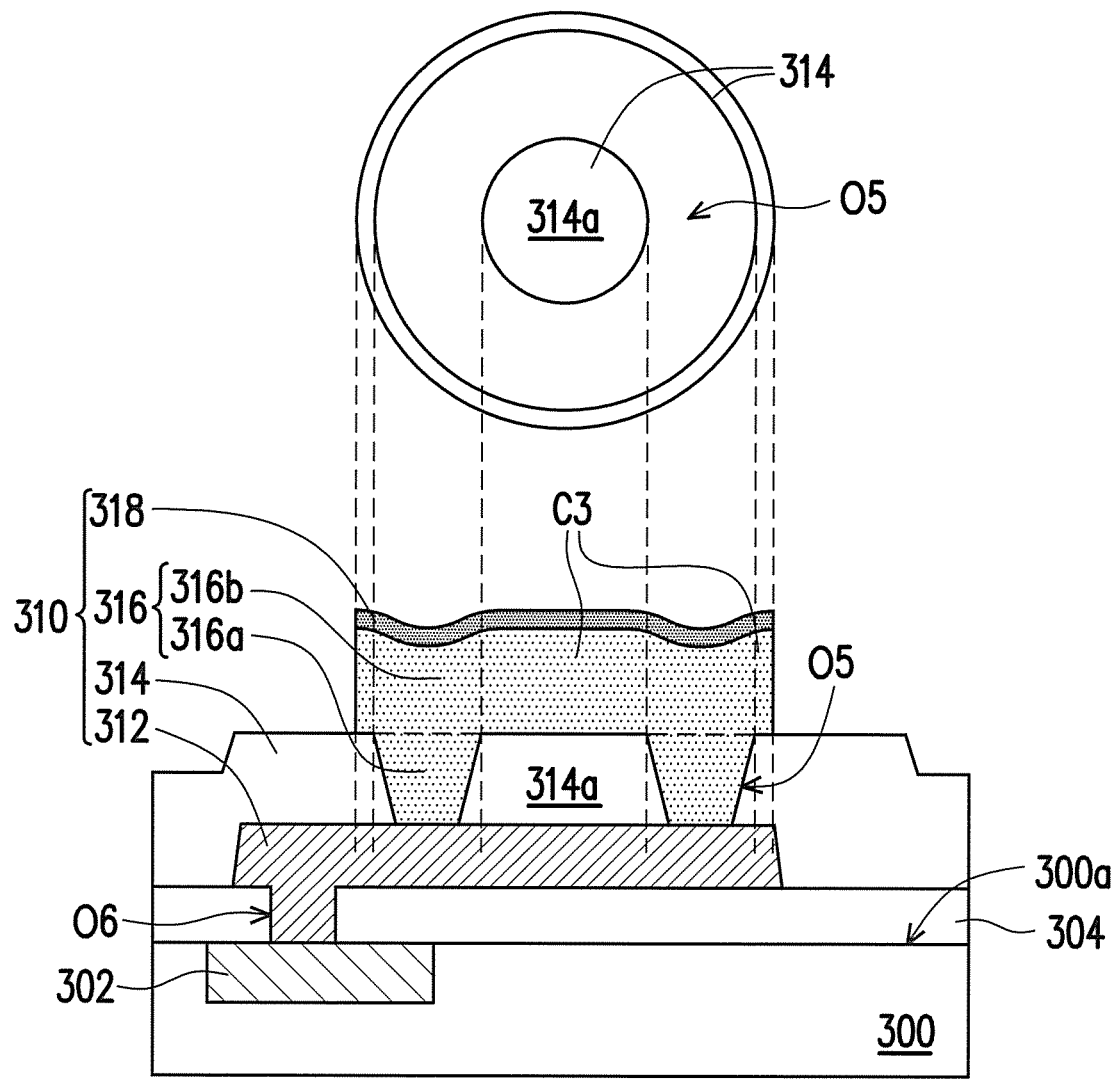
FIG. 3 is a schematic view illustrating a conductive terminal on an integrated circuit according to some other embodiments of the present disclosure.

FIG. 3 is a schematic view illustrating a conductive terminal on an integrated circuit according to some other embodiments of the present disclosure. Referring to FIG. 3, a conductive terminal 310 on an integrated circuit 300 is provided. The conductive terminal 310 includes a conductive pad 312, a dielectric layer 314, and a conductive via 316. The conductive pad 312 is disposed on and electrically to the integrated circuit 300. The dielectric layer 314 covers the integrated circuit 300 and the conductive pad 312, the dielectric layer 314 includes a ring-shaped contact opening O5, and the conductive pad 312 is partially exposed by the ring-shaped contact opening O5. The conductive via 316 is disposed on the dielectric layer 314 and electrically connected to the conductive pad 312 through the ring-shaped contact opening O5. The conductive via 316 includes a convex portion C3, the convex portion C3 is distributed on a top surface of the conductive via 316, and the convex portion C3 is corresponding to the dielectric layer 314 covered by the conductive via 316.

The integrated circuit 300 may include a semiconductor substrate, and the semiconductor substrate includes active components (e.g., transistors and so on) and passive components (resistors, inductors, capacitors, and so on) formed therein. In some embodiments, the integrated circuit 300 may include a plurality of bonding pads 302 and a passivation layer 304 formed on the active surface 300a thereof. Only one bonding pad 302 is shown in FIG. 3 for illustration, and the number of the bonding pad 302 is not limited in this disclosure. The bonding pad 302 is electrically connected to the active components and/or the passive components through an interconnection layer underneath. The interconnection layer is a part of the integrated circuit 300, and the bonding pad 302 having a pre-determined pattern may be considered as a top metal layer of the interconnection. The passivation layer 304 covers the active surface 300a of the integrated circuit 300 and includes a plurality of contact openings O6. Only one contact opening O6 is shown in FIG. 3 for illustration, and the number of the contact opening O6 is not limited in this disclosure. The bonding pad 302 is exposed by the contact opening O6 of the passivation layer 304. For example, the passivation layer 304 is formed of un-doped silicate glass (USG), silicon nitride, silicon oxy-nitride, silicon oxide, or combinations thereof, but is not limited by the above-mentioned materials.

As shown in FIG. 3, the conductive pad 312 of the conductive terminal 310 is formed on the passivation layer 304, and the conductive pad 312 is electrically connected to the bonding pad 302 of the integrated circuit 300 through the contact opening O6 of the passivation layer 304. In some embodiments, the conductive pad 312 may be an aluminum pad, a copper pad, or other suitable metallic pad.

For example, the dielectric layer 314 is formed of polymer, polyimide, benzocyclobutene (BCB), polybenzooxazole (PBO), or any other suitable dielectric material, but is not limited by the above-mentioned materials. In some embodiments, the materials of the passivation layer 304 and the dielectric layer 314 are different. However, in other embodiments, the materials of the passivation layer 304 and the dielectric layer 314 may be the same according to design requirements.

The dielectric layer 314 includes a dielectric island 314a surrounded by the ring-shaped contact opening O5. The center of circle of the ring-shaped contact opening O5 coincides with the center of the dielectric island 314a. In this embodiment, the area of the conductive via 316 is greater than the total area of the dielectric island 314a and the ring-shaped contact opening O5. Furthermore, the center of circle of the ring-shaped contact opening O5 is aligned with the center of the conductive via 316. The width of the ring-shaped contact opening O5 ranges from about 5 micrometers to about 10 micrometers, for example. The ring-shaped contact opening O5 is filled by the conductive via 316, and the dielectric layer 314 is partially covered by the conductive via 316. The diameter of the circular area occupied by the conductive via 316 ranges from about 45 micrometers to about 50 micrometers, for example. In this embodiment, the width the ring-shaped contact opening O5 is about 10 micrometers and the diameter of the circular area occupied by the conductive via 316 is about 50 micrometers, for example.

In some embodiments, the conductive via 316 may include a plurality of first conductive portions 316a embedded in the ring-shaped contact opening O5 of the dielectric layer 314 and a second conductive portion 316b connected to the first conductive portions 316a, and the second conductive portion 316b covers the first conductive portions 316a and the dielectric layer 314. The convex portions C3 are distributed on the top surface of the second conductive portion 316b.

Since the area of the ring-shaped contact opening O5 formed in the dielectric layer 314 ranges from about 486.9 $\mu m^2$ to about 1200.1 $\mu m^2$, the convex portions C3 are formed and distributed on the top surface of the conductive via 316 after forming the conductive via 316. It is noted that the dimension and the position of the convex portions C3 correspond to those of the dielectric layer 314 which is covered by the conductive via 316. In some embodiments, the conductive via 316 is formed through a plating process, and the convex portions C3 of the conductive via 316 are formed due to the morphology of the dielectric layer 314.

In some embodiments, the area of the convex portions C3 of the conductive via 316 may be about 39% to about 75% of the area occupied by the conductive via 316. Since the area of the convex portions C3 is sufficient for chip-probing, the morphology (i.e. the convex portions C3) of the conductive terminal 310 of the conductive via 316 enhance the testing stability of the chip-probing process.

As shown in FIG. 3, before performing the chip-probing process, a conductive cap 318 may be optionally formed to conformally cover the top surface of the conductive via 316. In some embodiments, the conductive cap 318 is a solder cap, for example. The conductive cap 318 (e.g., solder cap) facilitates the chip-probing process. After the chip-probing process is performed, the conductive cap 318 (e.g., solder cap) may be removed from the top surface of the conductive via 316. In other words, the conductive cap 318 (e.g., solder cap) may not exit after the chip-probing process is performed.

Figure 4:
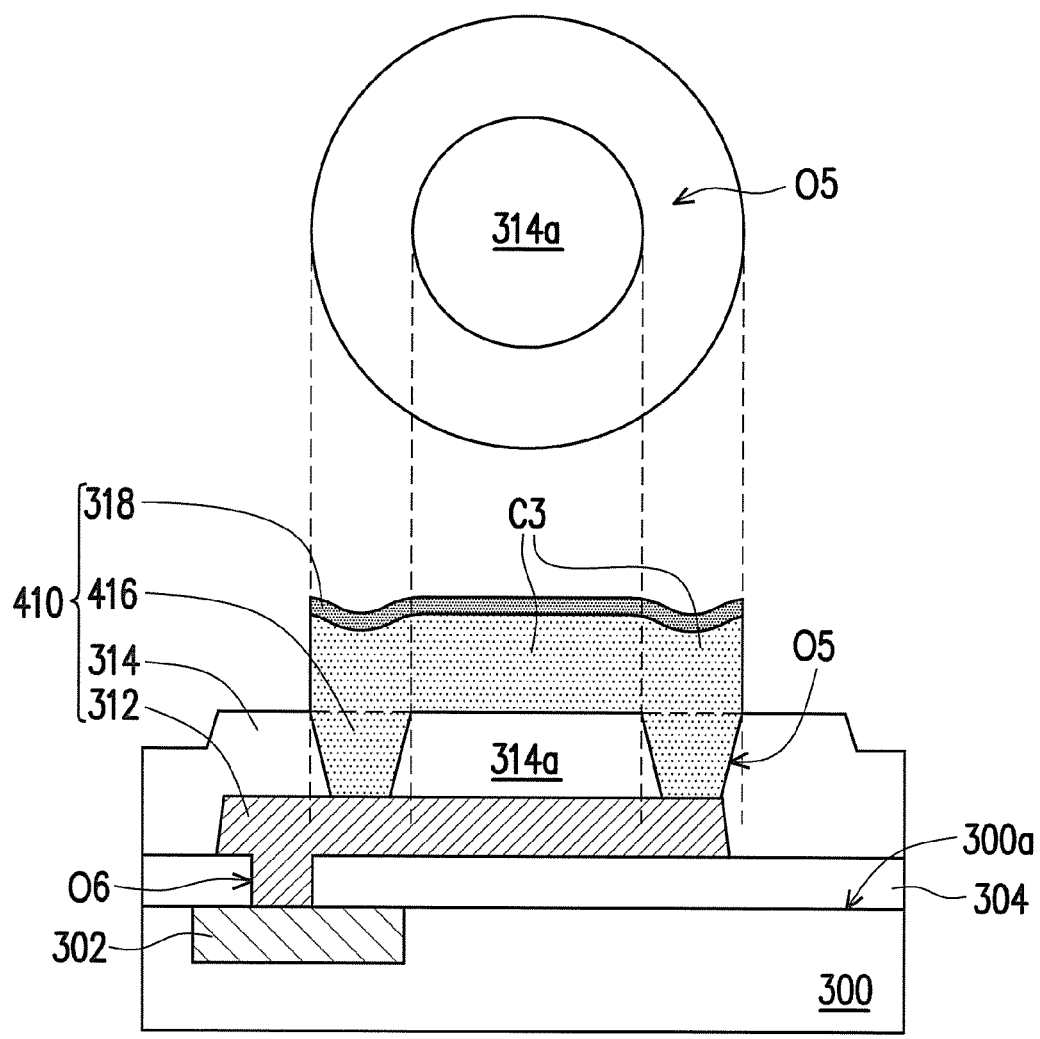
FIG. 4 is a schematic view illustrating a conductive terminal on an integrated circuit according to yet alternative embodiments of the present disclosure.

FIG. 4 is a schematic view illustrating a conductive terminal on an integrated circuit according to yet alternative embodiments of the present disclosure. Referring to FIGS. 3 and 4, the conductive terminal 410 of this embodiment is similar to the conductive terminal 310 as illustrated in FIG. 3 except that the area of the conductive via 416 is greater than the total area of the dielectric island 314a and the ring-shaped contact opening O5. In other words, the conductive via 416 merely covers the dielectric island 314a of the dielectric layer 314.

Figure 5:
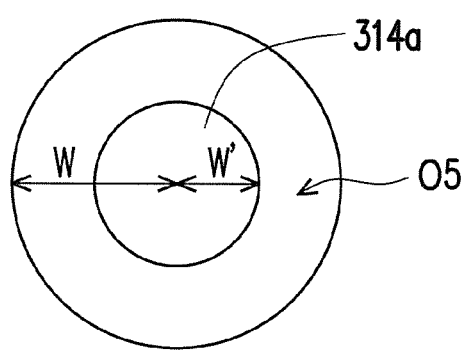
FIG. 5 is a schematic view illustrating the relation between the area of the dielectric island and the area of the ring-shaped contact opening.

FIG. 5 is a schematic view illustrating the relation between the area of the dielectric island 314a and the area of the ring-shaped contact opening O5. Referring to FIG. 5, in some embodiments, the area A1 of the dielectric island 314a and the area A2 of the ring-shaped contact opening O5 may satisfy the following formula: $1.5 \leq [(A1+A2)/A2] < 10$. In some embodiments, the tip size P of the probe, the diameter W' of the dielectric island 314a and the diameter W of the outer edge of the ring-shaped contact opening O5 may satisfy the following formula: $0.5P \leq W < 0.95$ W. For example, tip size P of the probe is about 30 micrometers, and the diameter W of the outer edge of the ring-shaped contact opening O5 is about 5 micrometers.

In the above-mentioned embodiments, the morphology of the conductive terminals is friendly to the chip-probing process. Accordingly, the testing stability and yield rate of the chip-probing process are enhanced by the morphology of the conductive terminals.

According to some embodiments, a conductive terminal on an integrated circuit is provided. The conductive terminal includes a conductive pad, a dielectric layer, and a conductive via. The conductive pad is disposed on and electrically to the integrated circuit. The dielectric layer covers the integrated circuit and the conductive pad, the dielectric layer includes a plurality of contact openings arranged in array, and the conductive pad is partially exposed by the contact openings. The conductive via is disposed on the dielectric layer and electrically connected to the conductive pad through the contact openings. The conductive via includes a plurality of convex portions arranged in array. The convex portions are distributed on a top surface of the conductive via, and the convex portions are corresponding to the contact openings.

According to some embodiments, a conductive terminal on an integrated circuit is provided. The conductive terminal includes a conductive pad, a dielectric layer, and a conductive via. The conductive pad is disposed on and electrically to the integrated circuit. The dielectric layer covers the integrated circuit and the conductive pad. The dielectric layer includes a plurality of contact openings, and the conductive pad is partially exposed by the contact openings. The conductive via is disposed on the dielectric layer and electrically connected to the conductive pad through the contact openings. The conductive via includes a plurality of convex portions. The convex portions are distributed on a top surface of the conductive via, and the convex portions are corresponding to the dielectric layer covered by the conductive via.

According to some embodiments, a conductive terminal on an integrated circuit is provided. The conductive terminal includes a conductive pad, a dielectric layer, and a conductive via. The conductive pad is disposed on and electrically to the integrated circuit. The dielectric layer covers the integrated circuit and the conductive pad, the dielectric layer includes a ring-shaped contact opening, and the conductive pad is partially exposed by the ring-shaped contact opening. The conductive via is disposed on the dielectric layer and electrically connected to the conductive pad through the ring-shaped contact opening. The conductive via includes a convex portion, the convex portion is distributed on a top surface of the conductive via, and the convex portion is corresponding to the dielectric layer covered by the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A conductive terminal on an integrated circuit, comprising:
   a conductive pad disposed on and electrically to the integrated circuit;
   a dielectric layer covering the integrated circuit and the conductive pad, the dielectric layer comprising a plurality of contact openings arranged in array, and the conductive pad being partially exposed by the contact openings; and
   a conductive via disposed on the dielectric layer and electrically connected to the conductive pad through the contact openings, the conductive via comprising a plurality of convex portions arranged in array, the conductive via comprising a plurality of first conductive portions embedded in the contact openings and a second conductive portion connected to the first conductive portions, the second conductive portion covering the first conductive portions and the dielectric layer, the second conductive portion comprising a plurality of first segments and a second segment connected to the first segments, the first segments covering the first conductive portions, the second segment covering the dielectric layer, a maximum thickness of each of the first segments being greater than a maximum thickness of the second segment, and the convex portions being distributed on top surfaces of the first segments.

2. The conductive terminal as claimed in claim 1, wherein each of the convex portions is distributed right above one of the contact openings.

3. The conductive terminal as claimed in claim 1, wherein the conductive via are cylindrical conductive vias, the contact openings are circular contact openings, a diameter of each of the contact openings ranges from about 8 micrometers to about 10 micrometers, a spacing between two of the contact openings adjacent to each other ranges from about 3 micrometers to about 5 micrometers, and a diameter of a circular area occupied by the conductive via ranges from about 45 micrometers to about 50 micrometers.

4. The conductive terminal as claimed in claim 1, wherein an area of the convex portions ranges from about 15.8% to about 20% of an area occupied by the conductive via.

5. The conductive terminal as claimed in claim 1 further comprising a conductive cap conformally covering a top surface of the second conductive portion of the conductive via.

6. The conductive terminal as claimed in claim 5, wherein the conductive cap comprises a solder cap.

7. A conductive terminal on an integrated circuit, comprising:
   a conductive pad disposed on and electrically to the integrated circuit;
   a dielectric layer covering the integrated circuit and the conductive pad, the dielectric layer comprising a plurality of arc-shaped contact openings, and the conductive pad being partially exposed by the arc-shaped contact openings; and
   a conductive via disposed on the dielectric layer and electrically connected to the conductive pad through the arc-shaped contact openings, the conductive via comprising a plurality of convex portions, the convex portions being distributed on a top surface of the conductive via, and the convex portions being corresponding to the dielectric layer covered by the conductive via, wherein the arc-shaped contact openings are separated from one another and arranged along a circular path, and a center of circle of the circular path is substantially aligned with a center of the conductive via.

8. The conductive terminal as claimed in claim 7, wherein each of the convex portions is distributed right above one of the dielectric layer covered by the conductive via.

9. The conductive terminal as claimed in claim 7, wherein the conductive via comprises a plurality of first conductive portions embedded in the arc-shaped contact openings and a second conductive portion connected to the first conductive portions, and the second conductive portion covers the first conductive portions and the dielectric layer.

10. The conductive terminal as claimed in claim 9, wherein the convex portions are distributed on a top surface of the second conductive portion.

11. The conductive terminal as claimed in claim 7 further comprising a conductive cap conformally covering the top surface of the conductive via.

12. The conductive terminal as claimed in claim 7, wherein an area of the convex portions ranges from about 74.7% to about 80% of an area occupied by the conductive via.

13. A conductive terminal on an integrated circuit, comprising:
   a conductive pad disposed on and electrically to the integrated circuit;
   a dielectric layer covering the integrated circuit and the conductive pad, the dielectric layer comprising a ring-shaped contact opening, and the conductive pad being partially exposed by the ring-shaped contact opening; and
   a conductive via disposed on the dielectric layer and electrically connected to the conductive pad through the ring-shaped contact opening, the conductive via comprising at least one convex portion, the at least one convex portion being distributed on a top surface of the conductive via, and the at least one convex portion being corresponding to the dielectric layer covered by the conductive via, wherein an area of the at least one convex portion ranges from about 39% to about 75% of an area occupied by the conductive via.

14. The conductive terminal as claimed in claim 13, wherein the at least one convex portion is above the dielectric layer covered by the conductive via.

15. The conductive terminal as claimed in claim 13, wherein the conductive via comprises ring-shaped conductive portions embedded in the ring-shaped contact opening and a circular conductive portion covering the ring-shaped conductive portion and a part of the dielectric layer surrounded by the ring-shaped conductive portion.

16. The conductive terminal as claimed in claim 15, wherein the at least one convex portion is distributed on a top surface of the circular conductive portion.

17. The conductive terminal as claimed in claim 13 further comprising a conductive cap conformally cover the top surface of the conductive via.

18. The conductive terminal as claimed in claim 13, wherein a width of the ring-shaped contact opening ranges from about 5 micrometers to about 10 micrometers and a diameter of a circular area occupied by the conductive via ranges from about 45 micrometers to about 50 micrometers.

19. The conductive terminal as claimed in claim 13, wherein the dielectric layer comprises a circular dielectric island surrounded by the ring-shaped contact opening, and the circular dielectric island partially covers the conductive pad.

20. The conductive terminal as claimed in claim 19, wherein an area of the conductive via is substantially equal to or greater than a total area of the circular dielectric island and the ring-shaped contact opening.

\* \* \* \* \*